United States Patent [19]

Tamura et al.

[11] Patent Number: 5,896,276
[45] Date of Patent: Apr. 20, 1999

[54] ELECTRONIC ASSEMBLY PACKAGE INCLUDING CONNECTING MEMBER BETWEEN FIRST AND SECOND SUBSTRATES

[75] Inventors: Koetsu Tamura; Shinichi Hasegawa, both of Tokyo, Japan

[73] Assignee: NEC Corporation, Tokyo, Japan

[21] Appl. No.: 08/520,791

[22] Filed: Aug. 30, 1995

[30] Foreign Application Priority Data

Aug. 31, 1994 [JP] Japan ................................ 6-206430
Sep. 30, 1994 [JP] Japan ................................ 6-236552

[51] Int. Cl.[6] ................................................. H05K 1/11
[52] U.S. Cl. ........................ 361/767; 361/803; 174/263; 174/266
[58] Field of Search .................................. 361/735, 743, 361/744, 749, 767–771, 774, 776, 779, 784, 789, 790, 803; 257/686, 692, 698, 700, 723, 724, 737, 738; 174/255, 260–263, 266; 439/66, 65, 91, 591; 228/180.21, 180.22

[56] References Cited

U.S. PATENT DOCUMENTS

| | | | |
|---|---|---|---|
| 4,170,677 | 10/1979 | Hutcheson | 439/91 |
| 4,604,644 | 8/1986 | Beckham et al. | 228/180.22 |
| 4,814,040 | 3/1989 | Ozawa | 156/634 |
| 5,089,440 | 2/1992 | Christie et al. | 29/841 |
| 5,120,591 | 6/1992 | Tomita | 428/138 |
| 5,121,190 | 6/1992 | Hsiao et al. | 228/180.22 |
| 5,203,075 | 4/1993 | Angulas et al. | 29/830 |
| 5,367,435 | 11/1994 | Andros et al. | 361/743 |
| 5,371,328 | 12/1994 | Gutierrez et al. | 361/767 |
| 5,416,278 | 5/1995 | Ostrem et al. | 174/263 |
| 5,431,571 | 7/1995 | Hanrahan et al. | 439/91 |
| 5,474,458 | 12/1995 | Vafi et al. | 439/91 |
| 5,576,519 | 11/1996 | Swamy | 361/790 |

FOREIGN PATENT DOCUMENTS

| | | |
|---|---|---|
| 0 117 809 | 9/1989 | France . |
| 01-042193 | 2/1989 | Japan . |
| 1307236 | 12/1989 | Japan . |
| 04-261519 | 9/1992 | Japan . |
| 05-167242 | 7/1993 | Japan . |
| 06 061642 | 3/1994 | Japan . |
| WO 94/21098 | 9/1994 | WIPO . |

OTHER PUBLICATIONS

Electronic Materials and Processes Handbook, 2nd ed., Harper & Sampson, eds., McGraw–Hill, Inc.: Article by W.M. Alvino: Plastics,Elastomers and Processing for Electronics; pp. 1.1,1.14,1.21,1.17,1.20,1.41–42, 1994.

Article from the Society for Hybrid Microelectronics— (Concise statement of relevance attached to article).

French Search Report, dated Jan. 12, 1998.

*Primary Examiner*—Leo P. Picard
*Assistant Examiner*—John B. Vigushin
*Attorney, Agent, or Firm*—McGinn & Gibb, P.C.

[57] ABSTRACT

An electronic device assembly includes a large-scale integrated circuit (LSI) chip mounted on a flexible substrate. The flexible substrate is connected to a second substrate via solder. The flexible substrate is also attached to the second substrate via a resin. When the assembly is manufactured, the solder is provided between the substrates. The resin fills an area between the substrates. The solder and the resin are heated simultaneously. The solder melts to electrically connect the substrates. The resin is set to mechanically couple the substrates.

4 Claims, 6 Drawing Sheets

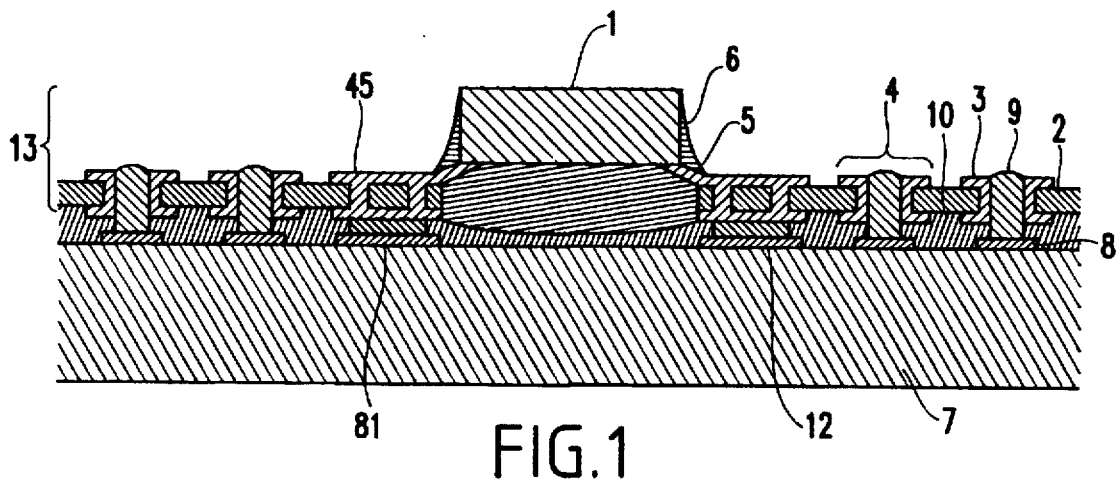
FIG.1
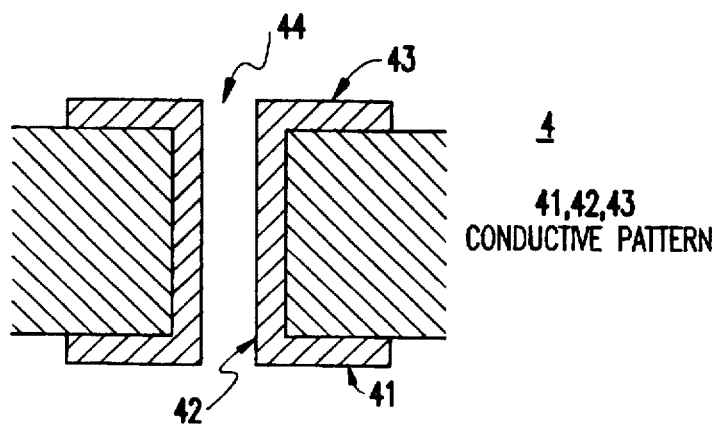
FIG.2A    4
41,42,43 CONDUCTIVE PATTERN
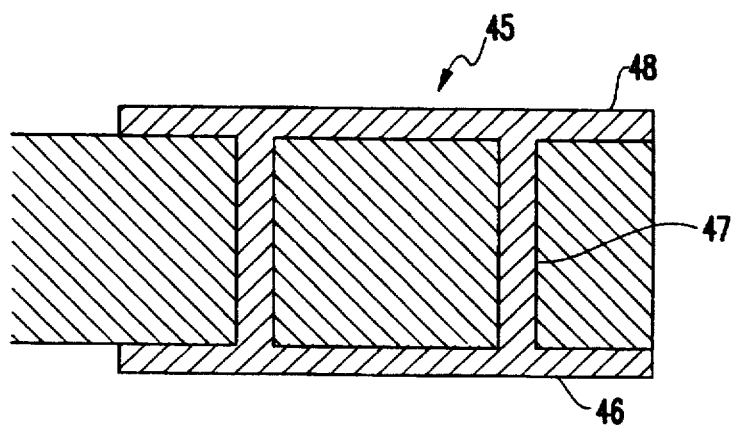
FIG.2B   46,47,48 CONDUCTIVE PATTERN

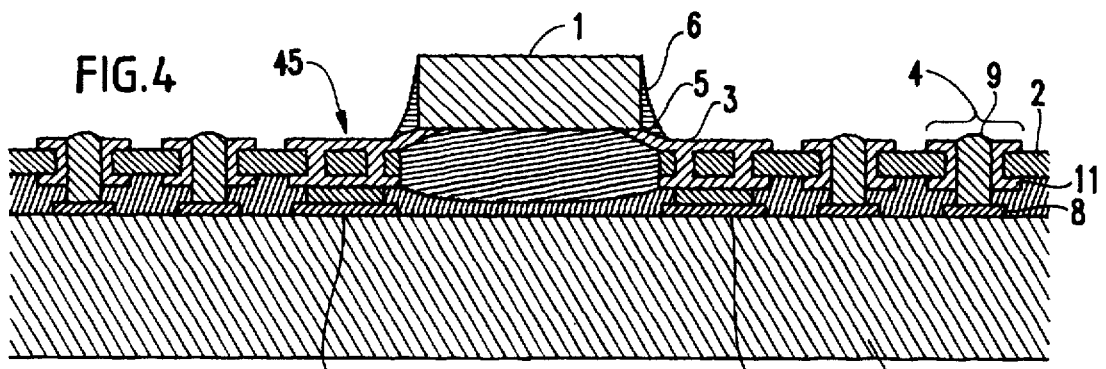
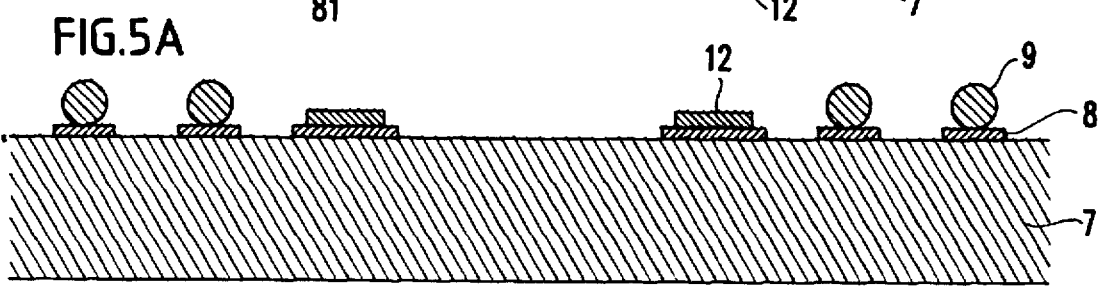
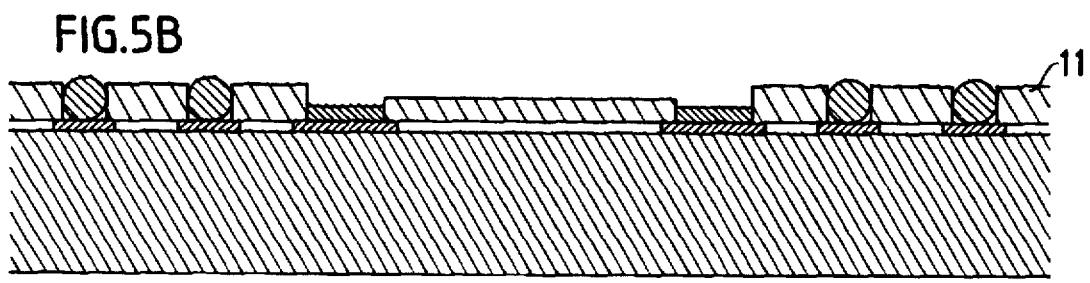
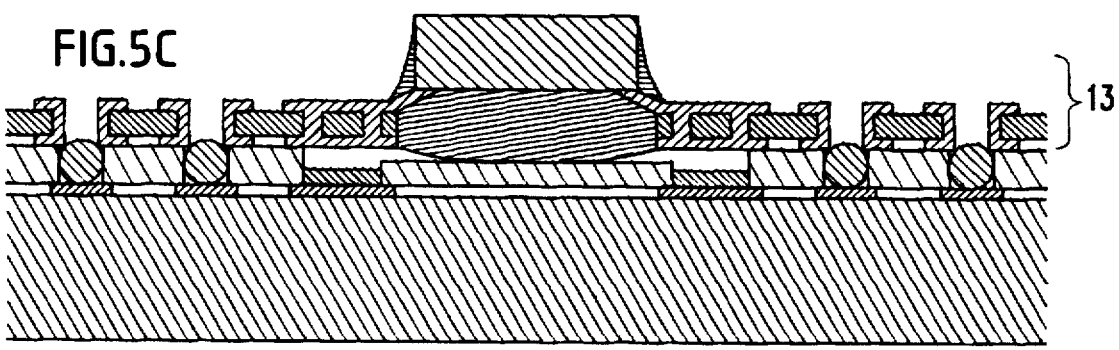
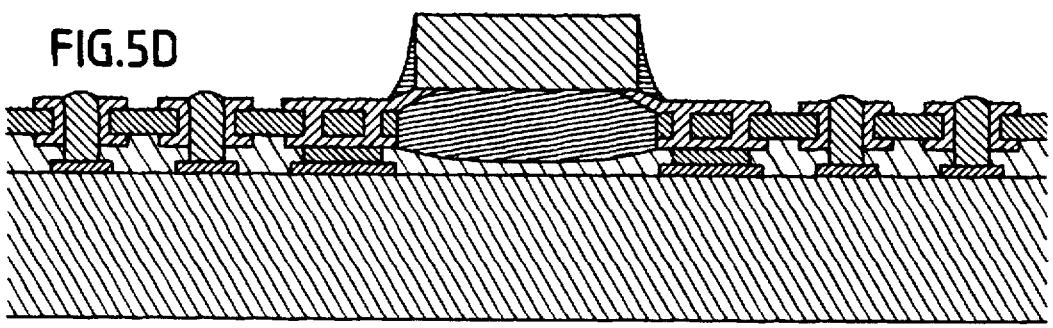

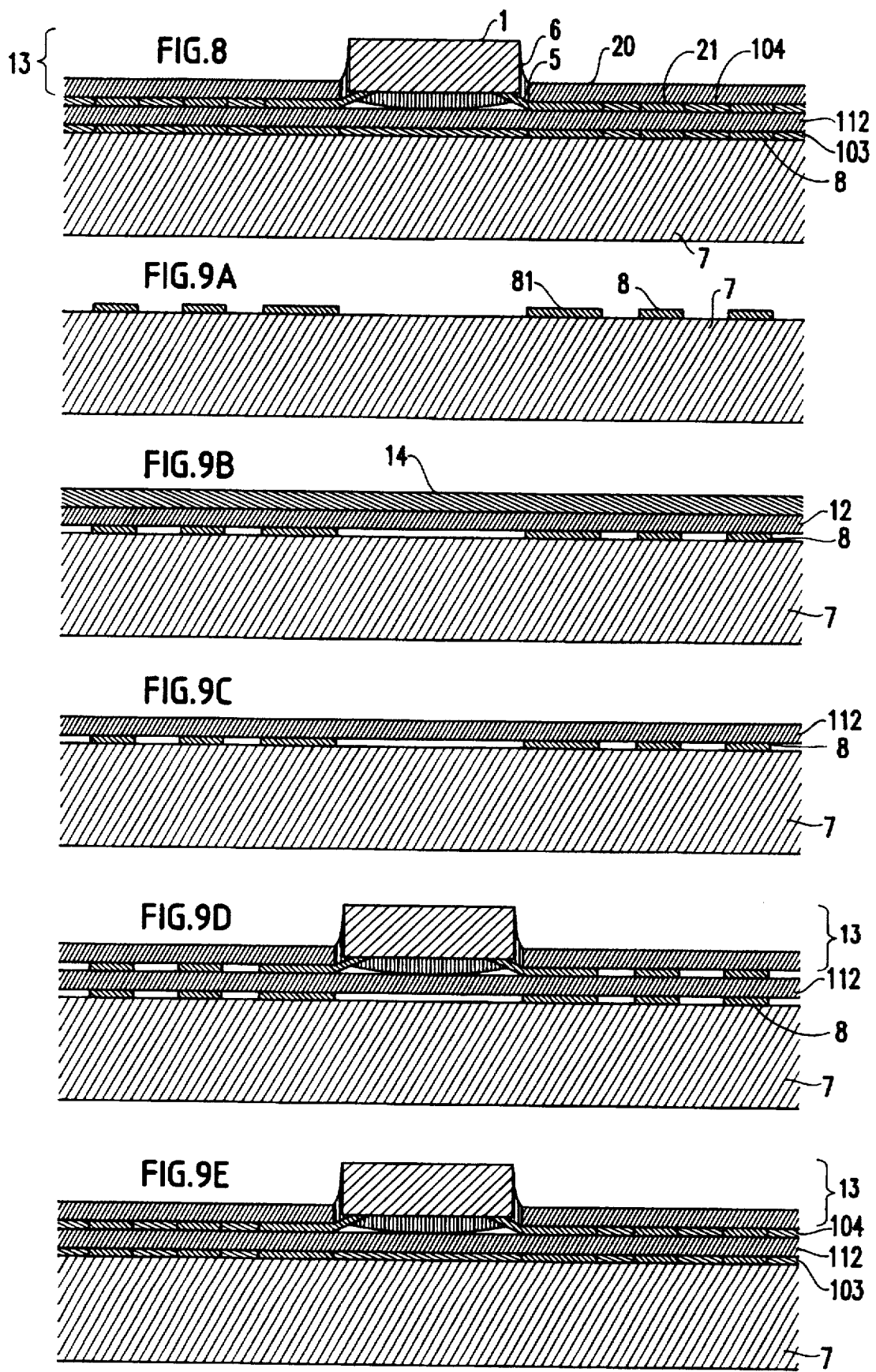

ELECTRONIC ASSEMBLY PACKAGE INCLUDING CONNECTING MEMBER BETWEEN FIRST AND SECOND SUBSTRATES

BACKGROUND OF THE INVENTION

The present invention relates to an electronic device assembly, and more particularly to an electronic device assembly including a first substrate and a second substrate mounted on the first substrate.

An example of a conventional electronic device is disclosed in U.S. Pat. No. 5,203,075.

Referring to FIG. 10 of the above reference, a semiconductor device 43 is mounted on a flexible substrate 31. The flexible substrate 31 is connected to a substrate 13 via solder.

Referring to FIGS. 6 and 9 of the reference, a solder member 32 and a solder paste 27 connect the flexible substrate 31 and the substrate 13. Part of the solder member 32 is positioned in a through-hole provided in the flexible substrate 31.

The aforementioned structure has the following problems.

First, the solder connection is susceptible to failure because it is not protected from mechanical stress. Specifically, the solder connection is apt to fall off, be broken, or be short circuited with the adjacent solder connection. This problem becomes serious when a relatively heavy device such as a heat sink is mounted on the flexible substrate. The failure of the solder connection is also caused by thermal cycling (i.e., repetitive heating and cooling).

Second, the solder is further susceptible to failure because it is not protected from air humidity (e.g., the moisture in the air).

Third, it is difficult to control the gap precisely between the flexible substrate 31 and the substrate 13 because it is difficult to keep the flexible substrate 31 flat. If the gap between the flexible substrate 31 and the substrate 13 is uneven, the reliability of the solder connection decreases.

SUMMARY OF THE INVENTION

In view of the aforementioned problems, one object of the present invention is to enhance the reliability of the connection between substrates. Specifically, the connection is protected from mechanical stress, stress due to thermal cycling, and air humidity.

Another object of the present invention is to easily control the gap between the substrates.

According to the present invention, an electronic device assembly includes a first substrate, a second substrate, a connecting member, and a resin. The first substrate has a first surface, a second surface and a connecting structure on the second surface. The second substrate has a first surface, a second surface and a first pad formed on the second surface. The first pad faces the connecting structure of the first substrate. The connecting member is interposed between the first and second substrates and connects the connecting structure and the first pad. The resin is provided between the first and second substrates. The first substrate is attached to the second substrate by the resin.

The connecting member may include solder. The connecting structure may include a through-hole provided in the first substrate. At least a part of the solder may be positioned in the through-hole.

The connecting member may include a film and a conductive body provided in the film. The conductive body is interposed between and connects the first pad and the connecting structure. The resin fills an area between the first substrate and the film and an area between the film and the second substrate.

The connecting structure may include a second pad provided on the second surface of the first substrate. The connecting member may include an anisotropic conductive sheet connecting the first and second pads. The resin fills an area between the first substrate and the anisotropic conductive sheet and an area between the anisotropic conductive sheet and the second substrate.

According to the present invention, the electronic device assembly may be manufactured by the following process. In a first step, the first substrate is prepared. In the second step, the second substrate is prepared. In a third step, solder is provided on the first pad. In a fourth step, the first substrate is positioned so that the connecting structure is positioned on the solder. In a fifth step, a resin is prepared between the first and second substrate. In a sixth step, the solder and the resin are heated simultaneously. The solder melts to connect the first pad and the connecting structure. The resin is set to couple the first substrate to the second substrate.

The process may include a step of confirming whether at least a portion of the solder protrudes from the through-hole of the first substrate.

The electronic device assembly may also be manufactured by the following process. In a first step, the first substrate is prepared. In a second step, the second substrate is prepared. In a third step, solder is prepared on the first pad. In a fourth step, the resin is positioned on the first surface of the second substrate. In a fifth step, the first substrate in positioned so that the connecting structure is positioned on the solder. In a sixth step, the solder and the resin are heated simultaneously. The solder is melted to connect the first pad and the connecting structure. The resin is set to couple the first substrate to the second substrate.

The electronic device assembly also may be manufactured by the following process. In a first step, the first substrate is prepared. In a second step, the second substrate is prepared. In a third step, a connecting member is prepared. The connecting member includes a film having first and second surfaces and a conductive body provided in the film. The first and second portions of the conductive body protrudes from the first and second surfaces of the film, respectively. In a fourth step, the connecting member is positioned so that the second portion of the conductive body is positioned on the first pad of the second substrate. In a fifth step, the first substrate is positioned so that the connecting structure is positioned on the first portion of the conductive body. In a sixth step, the first pad is connected to the second portion of the conductive body. The first portion of the conductive body is connected to the connecting structure. In a seventh step, a resin is prepared between the first substrate and the film and between the film and the second substrate. In a eighth step, the resin is set.

The electronic device assembly may be manufactured by the following process. In a first step, the first substrate is prepared. In a second step, the second substrate is prepared. In a third step, an anisotropic conductive sheet is positioned on the second pad of the second substrate. In a third step, the first substrate is positioned on the anisotropic conductive sheet so that the first pad faces the second pad via the anisotropic conductive sheet. In a fourth step, a resin is provided between the first substrate and the anisotropic conductive sheet and between the anisotropic conductive sheet and the second substrate. In a fifth step, the resin is set.

BRIEF DESCRIPTION OF THE DRAWINGS

Other objects, features and advantages of the present invention will become more apparent when the following description is read in conjunction with the accompanying drawings, wherein:

FIG. 1 shows the structure of a first embodiment of the present invention.

FIG. 2(a) shows the detailed structure of a connecting structure 4.

FIG. 2(b) shows the detailed structure of a connecting structure 45.

FIG. 4 shows the structure of a second embodiment of the present invention.

FIGS. 5(a)–5(d) illustrate a manufacturing process of the second embodiment.

FIG. 8 shows the structure of a fourth embodiment of the present invention.

FIGS. 9(a)–9(e) illustrate the manufacturing process of the fourth embodiment.

In these drawings, the same reference numerals depict the same parts, respectively.

DETAILED DESCRIPTION OF THE PREFERRED EMBODIMENTS

Figure 3A:
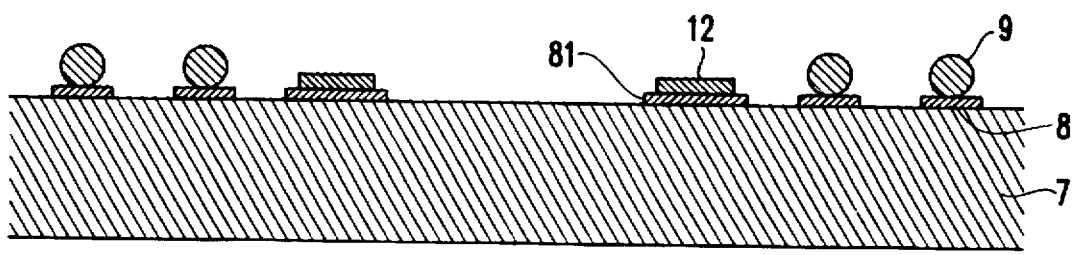
FIGS. 3(a)–3(d) illustrate the manufacturing process of the first embodiment.

Next is described a first embodiment of the present invention.

Referring to FIG. 1, an electronic device assembly according to the first embodiment comprises a substrate 7 and a chip carrier 13 mounted on the substrate 7.

In this exemplary embodiment, the substrate 7 is a glass-epoxy substrate. However, other substrates such as ceramic substrates can be used as the substrate 7. The substrate 7 has pads 8 and 81 on the upper surface thereof. The pads 8 and 81 are preferably formed from copper and plated with gold.

The chip carrier 13 includes a flexible substrate 2, a large-scale-integrated circuit (LSI) chip mounted on the flexible substrate 2, and a resin 6 covering the lower surface of the LSI chip.

In the exemplary embodiment, the LSI chip 1 is square-shaped having a length of approximately 17.5 mm. The LSI chip 1 has 800 terminals along each of the sides thereof. The terminals are aligned with approximately an 80 μm pitch.

The flexible substrate 2 is made of an organic insulating film. The flexible substrate 2 is preferably made from materials having suitable heat resistance and a relatively low thermal expansion coefficient. The flexible substrate 2 is preferably easily attachable to conductor patterns. Materials for the flexible substrate 2 include polyimide, fluorine-type materials, and epoxy-type materials. In this exemplary embodiment, the flexible substrate 2 has a thickness of about 50 μm.

The flexible substrate 2 has a device hole in the center portion thereof. Inner leads 5 are formed on the upper surface of the flexible substrate and protrude above the device hole. One end of the inner lead 5 is connected to a corresponding terminal of the LSI. The inner lead 5 is encapsulated in the resin 6.

Referring to FIGS. 1 and 2(a), the flexible substrate 2 has a connecting structure 4. The connecting structure 4 includes a through-hole 44, and conductive patterns 41, 42, and 43. The conductive patterns 41, 42, and 43 are formed on the lower surface of the flexible substrate 2, the inner surface of the through-hole 44, and the upper surface of the flexible substrate 2, respectively. The conductive patterns 41, 42 and 43 are preferably formed from copper and plated with gold.

The connecting structure 4 is connected to the corresponding inner lead 5 via a wiring pattern 3 formed on the upper surface of the flexible substrate 2. The wiring pattern is preferably formed from copper and plated with gold. The thickness of the wiring pattern is about 10 to 25 μm.

Referring to FIGS. 1 and 2(b), the flexible substrate 2 has a connecting structure 45 along the side of the device hole. The connecting structure 45 includes a conductive pattern (ground plane) 46 and 48 formed on the upper and lower surfaces of the flexible substrate 2, respectively. The conductive patterns 46 and 48 are connected by a via 47. The connecting structure 45 is connected to the corresponding inner lead 5 through the wiring pattern 3. The connecting structure 45 has advantages in reducing noise, avoiding cross-talk, and impedance matching.

Referring again to FIG. 1, a solder paste 12 connects the connecting structure 45 and the pad 81. Solder 9 connects the connecting structure 4 and the pad 8. A part of the solder 9 is placed in the through-hole and appears on the upper surface of the flexible substrate 2 to indicate a reliable connection.

A thermosetting resin 10 fills an area between the flexible substrate 2 and the substrate 7. The flexible substrate 2 is attached to and integrated with the substrate 7 by the thermosetting resin 10. The thermal expansion coefficient of the resin 10 is preferably between those of the flexible substrate 2 and the substrate 7. The temperature at which the thermosetting resin 10 begins to set is about 130° C. to 230° C. The melting temperature of the solder 9 and the solder paste 12 is about 180° C. to 230° C. Epoxy-type resins and fluorine-type resins can be used as the thermosetting resin 10.

Next is described the manufacturing method of the first embodiment.

Referring to FIG. 3(a), in a first step, the solder 9 and the solder paste 12 are provided on the pads 8 and 81, respectively. Before placing the solder 9 on the pad 8, a solder paste may be applied on the pad 8 to attach the solder 9 to the pad 8.

Figure 3B:
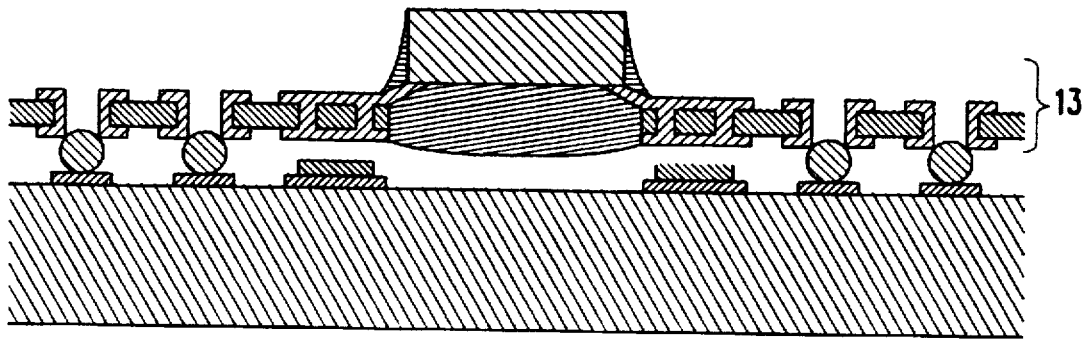

Referring to FIG. 3(b), in a second step, the chip carrier 13 is positioned so that the connecting structures 4 and 45 are placed on the solder 9 and the solder paste 12, respectively. The LSI chip 1 is previously mounted on the flexible substrate 2 by tape automated bonding.

Figure 3C:
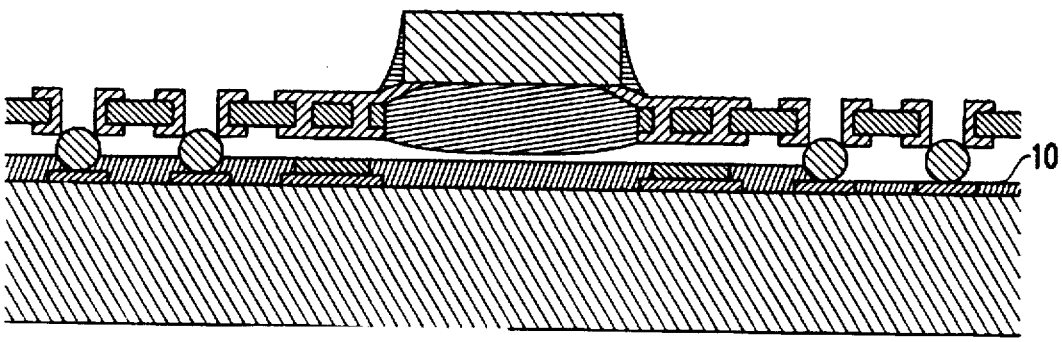

Referring to FIG. 3(c), in a third step, the thermosetting resin 10 is applied over the upper surface of the substrate 7 except for over the solder 9 and the solder paste 12. The thermosetting resin 10 may be injected through the gap between the flexible substrate 2 and the substrate 7. The thermosetting resin 10 may also be injected through an injection hole provided in the flexible substrate 2.

Figure 3D:
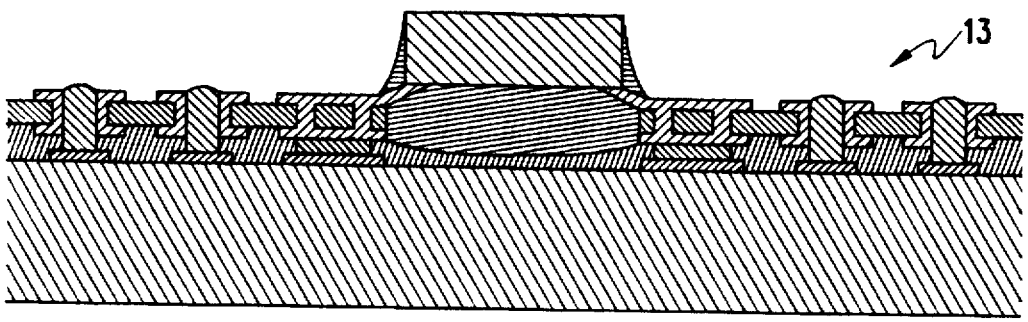

Referring to FIG. 3(d), in a fourth step, reflow soldering is performed. The solder 9 melts to flow into the through-hole 44 and appears on the upper surface of the flexible substrate 2. The connection failure of the solder 9 can easily be detected by confirming whether or not the solder 9 protrudes from the through-hole 44. As the solder 9 flows into the through-hole 44, the flexible substrate 2 moves down to contact the thermosetting resin 10 at the lower surface thereof. The solder paste 12 also melts to connect the pad 81 and the connecting structure 45.

In this reflow soldering, the thermosetting resin 10 is set. The flexible substrate 2 is attached to and integrated with the substrate 7 by the setting of thermosetting resin 10.

Next is described the technical advantages of the first embodiment.

In the first embodiment, the solder connection is protected from mechanical stress and stress due to thermal cycling because the flexible substrate 2 is attached to the substrate 7 by the thermosetting resin 10. Moreover, the solder connection is protected from relative humidity because the solder connection is encapsulated in the thermosetting resin 10. Thus, the reliability of the solder connection is enhanced.

The manufacturing process of the first embodiment is relatively simple because the melting of the solder and the setting of the thermosetting resin are performed by simultaneous heating.

Next is described the second embodiment of the present invention.

A key feature of the second embodiment is using a thermosetting resin sheet instead of the thermosetting resin 10. Other structures and functions are the same as those of the first embodiment.

Referring to FIG. 4, in the second embodiment, a thermosetting resin sheet 11 is provided between the flexible substrate 2 and the substrate 7. The thermosetting resin sheet 11 has openings at positions corresponding to the pads 8 and 81. The pads 8 and 81 are reachable through the openings.

The thickness of the thermosetting resin sheet 11 is optimally selected so that a desired gap is formed between the flexible substrate 2 and the substrate 7.

Next is described the manufacturing method of the second embodiment.

Referring to FIG. 5(a), in a first step, the solder 9 and the solder paste 12 are provided on the pads 8 and 81, respectively.

Referring to FIG. 5(b), in a second step, the thermosetting resin sheet 11 is placed on the upper surface of the substrate 7. The solder 9 and the solder paste 12 are not covered with the thermosetting resin sheet because of the openings provided therein.

Referring to FIG. 5(c), in a third step, the chip carrier 13 is positioned so that the connecting structures 4 and 45 are placed on the solder 9 and the solder paste 12, respectively.

Referring to FIG. 5(d), in a fourth step, the solder 9, the solder paste 12, and the thermosetting resin sheet 11 are heated. The solder 9 melts to connect pad 8 and the connecting structure 4. A part of the solder 9 flows into the through-hole 44. The solder paste 12 melts to connect pad 81 and the connecting structure 45. The flexible substrate 2 moves down to contact the thermosetting resin sheet 11.

In this heating, the thermosetting resin sheet 11 is set simultaneously. The flexible substrate 2 is attached to and integrated with the substrate 7 by the thermosetting resin sheet 11 .

Next is described the technical advantages of the second embodiment.

In addition to the technical advantages of the first embodiment, in the second embodiment, the gap between the flexible substrate 2 and the substrate 7 can be selectively controlled by changing the thickness of the thermosetting resin sheet 11.

Next is described the third embodiment of the present invention.

A key feature of the third embodiment is a connecting member 93 interposed between the flexible substrate 2 and the substrate 7. The other structures and functions are substantially the same as those of the first embodiment.

Figure 6:
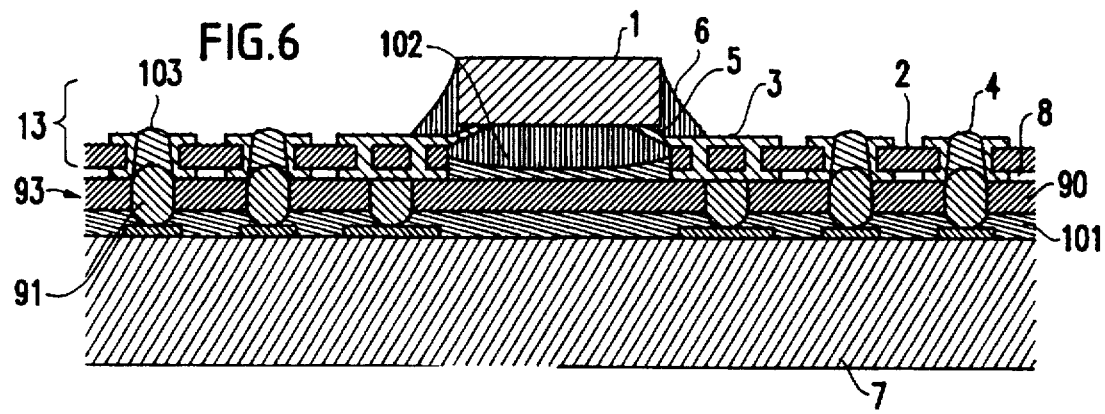
FIG. 6 shows the structure of a third embodiment of the present invention.

Referring to FIG. 6, a connecting member 93 is interposed between the flexible substrate 2 and the substrate 7. The connecting member 93 includes a film 90 and conductive bodies 91.

In this exemplary embodiment, the film 90 is formed from epoxy-type materials or polyimide-type materials. A ceramic sheet can be used instead of the film 90. In this exemplary embodiment, the thickness of the film 90 is about 0.1 mm to 0.5 mm.

The conductive body 91 is preferably made from metals such as gold and copper. The upper and lower portions of the conductive body 91 protrude from the upper and lower surfaces of the film 90, respectively. The upper and lower portions of the conductive body 91 are coated with solder. The conductive body 91 connects the pad 8 and the connecting structure 4. The conductive body 91 connects the pad 81 and the connecting structure 45. The upper-portion of the conductive body 91 is inserted in the through-hole 44 to position the flexible substrate 2 precisely. The height of the conductive body 91 is set so that a desirable gap (e.g., predetermined by the designer) is formed between the flexible substrate 2 and the substrate 7. In this exemplary embodiment, the height of the conductive body 91 is about 0.2 mm to 0.5 mm.

A resin 101 fills an area between the substrate 7 and the film 90. The thermal expansion coefficient of the resin 101 is preferably between those of the substrate 7 and the film 90. A resin 102 fills an area between the film 90 and the flexible substrate 2. The thermal expansion coefficient of the resin 102 is preferably between those of the LSI chip 1 and the film 90. In this exemplary embodiment, the resins 101 and 102 are thermosetting resins. However, other resins can suitably be used as the resins 101 and 102 so long as they are set by some means.

Next is described the manufacturing method of the third embodiment.

Figure 7A:
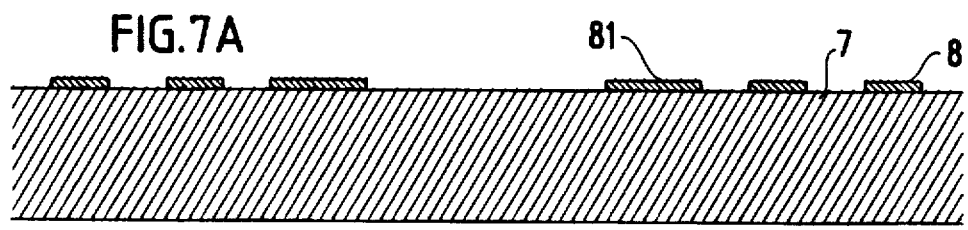
FIGS. 7(a)–7(d) illustrate the manufacturing process of the third embodiment.

Referring to FIG. 7(a), in a first step, the substrate 7 is prepared.

Figure 7B:
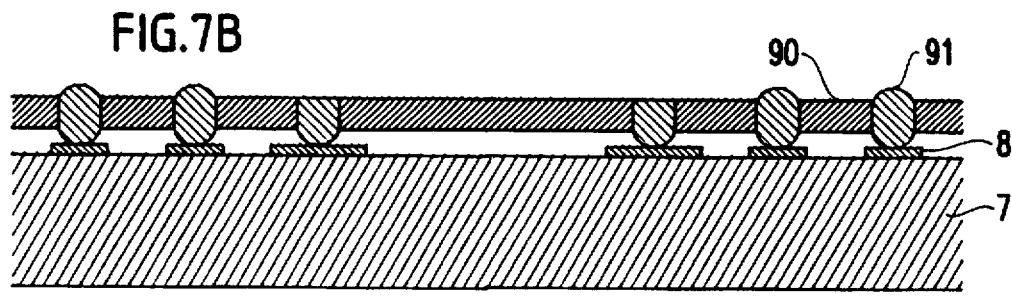

Referring to FIG. 7(b), in a second step, the connecting member 93 is positioned so that the lower portion of the conductive body 91 is placed on the pad 8.

Figure 7C:
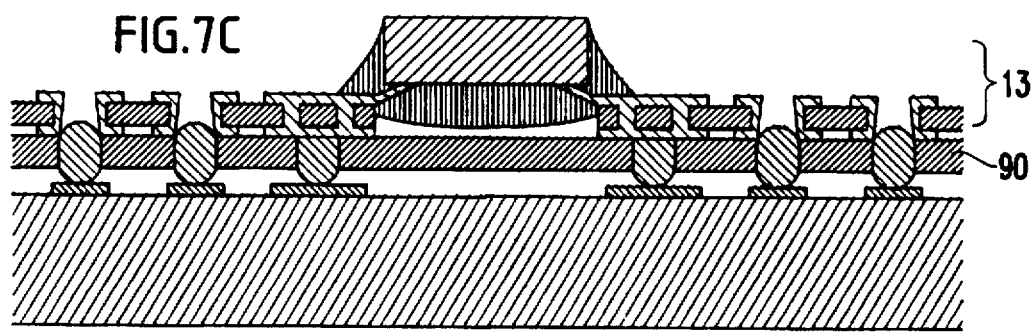

Referring to FIG. 7(c), in a third step, the chip carrier 13 is positioned so that the connecting structure 4 is placed on the upper portion of the conductive body 91. The upper portion of the conductive body 91 is inserted into the through-hole 44. Thereafter, the conductive body 91 is heated. The solder coated on the conductive body 91 melts to connect the conductive body 91 to the pad a and the connecting structure 4.

Figure 7D:
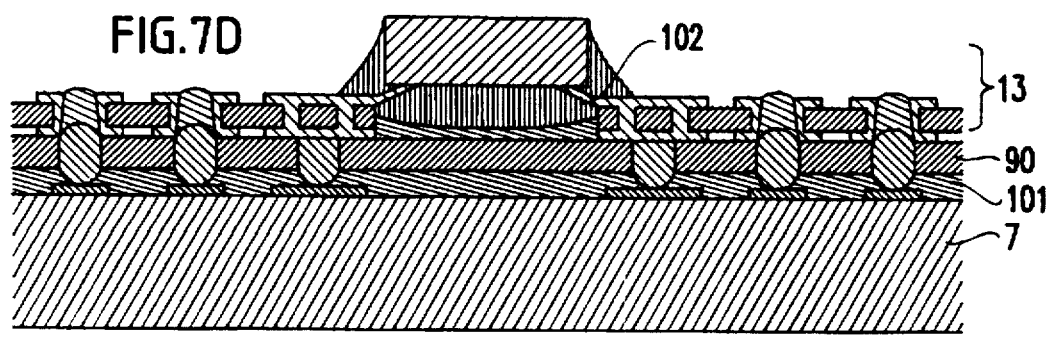

Referring to FIG. 7(d), in a fourth step, the resin 101 fills an area between the substrate 7 and the film 90. The resin 102 fills an area between the film 90 and the flexible substrate 2. Thereafter, the resins 101 and 102 are heated and set. The flexible substrate 2, the connecting member 93, and the substrate 7 are integrated by the resins 101 and 102.

Next is described the technical advantages of the third embodiment.

In the third embodiment, the reliability of connecting portions is enhanced as in the first embodiment.

Further, the gap between the flexible substrate 2 and the substrate 7 can be selectively controlled by varying the height of the conductive body 91.

Next is described the fourth embodiment of the present invention.

A key feature of the fourth embodiment is an anisotropic conductive sheet 112 electrically connecting the flexible substrate 20 and the substrate 7.

Referring to FIG. 8, the structures and functions of an LSI chip 1, resin 6, and the substrate 7 are the same as those of the first embodiment.

The chip carrier includes a flexible substrate 20, and LSI chip mounted on the flexible substrate 20.

The flexible substrate 20 has a device hole in the center thereof. Inner leads 5 are formed on the lower surface of the flexible substrate 20. One end of the inner lead 5 protrudes below the device hole and is connected to the terminals of the LSI chip 1. Pads 21 are formed on the lower surface of the flexible substrate 20. The pads 21 are preferably formed from copper and plated with gold. The inner leads 5 and the pads 21 are connected via wiring patterns (not shown) formed on the lower surface of the flexible substrate 20.

An anisotropic conductive sheet 112 is interposed between the flexible substrate 20 and the substrate 7. The pad 21 of the flexible substrate 20 and the pad 8 of the substrate 7 are electrically connected via the anisotropic conductive sheet 112. The anisotropic conductive sheet 112 comprises a thermosetting resin and metallic particles dispersed in the thermosetting resin. The thickness of the anisotropic conductive sheet 112 is selectively set so that a desirable gap is formed between the flexible substrate 20 and the substrate 7.

A resin 103 fills an area between the substrate 7 and the anisotropic conductive sheet 112. The thermal expansion coefficient of the resin 103 is preferably between those of the substrate 7 and the anisotropic conductive sheet 112. A resin 104 fills an area between those of the anisotropic conductive sheet 112 and the flexible substrate 20. In this exemplary embodiment, the resins 103 and 104 are thermosetting resins.

Next is described the fourth embodiment of the present invention.

Referring to FIG. 9(a), in a first step, the substrate 7 is prepared.

Figure 10A:
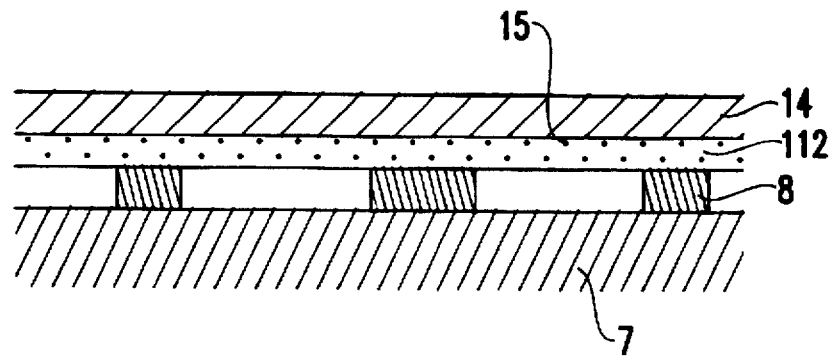
FIGS. 10 (a)–10(d) illustrate the manufacturing process of the fourth embodiment.

Referring to FIGS. 9(b) and 10(a), in a second step, the anisotropic conductive sheet 112 is placed on the pad 8. A separator sheet 14 is attached to the upper surface of the anisotropic conductive sheet 112 for easy handling. However, separator sheet 14 is easily detachable from sheet 112.

Figure 10B:
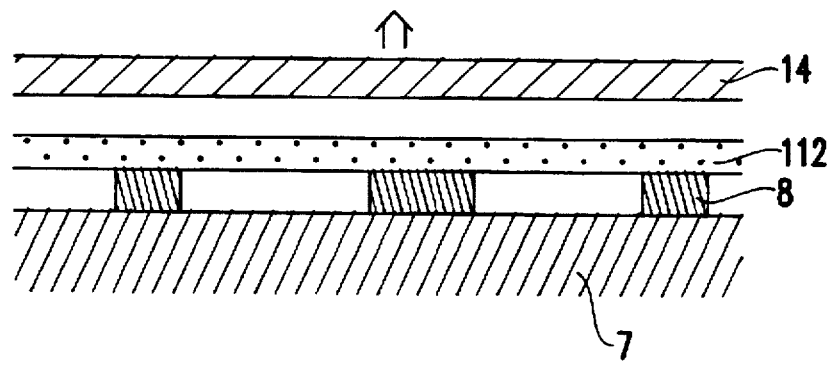

Referring to FIGS. 9(c) and 10(b), in a third step, the separator sheet 14 is removed from the anisotropic conductive sheet 112.

Figure 10C:
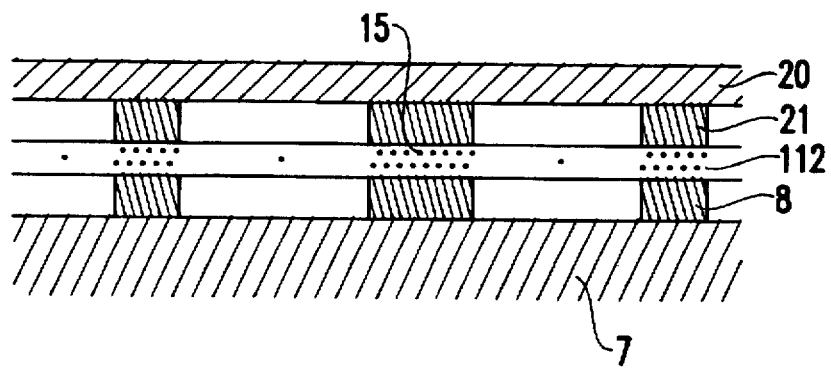

Referring to FIGS. 9(d) and 10(c), in a fourth step, the chip carrier 131 is placed on the anisotropic conductive sheet 112 so that the pad 21 faces the corresponding pad 8 via the anisotropic conductive sheet 112. Thereafter, the anisotropic conductive sheet 112 is thermocompression bonded to the pads 8 and 21. By this thermocompression bonding, the thermosetting resin in the anisotropic conductive sheet 112 is set. The metallic particles in the thermosetting resin concentrate (e.g., are positioned) between the pads 8 and 21. Thus, the pads 21 and 8 are electrically connected.

Figure 10D:
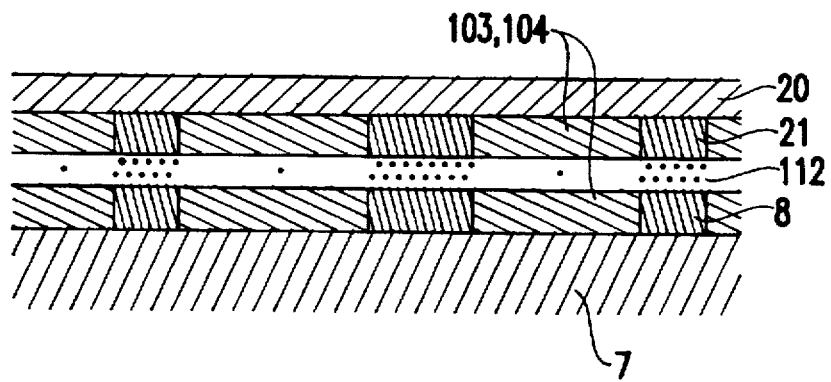

Referring to FIGS. 9(e) and 10(d), in a fifth step, the resin 103 fills an area between the substrate 7 and the anisotropic conductive sheet 112. The resin 104 fills an area between the anisotropic conductive sheet 112 and the flexible substrate 20. Thereafter, the resins 103 and 104 are heated and set. Thus, the chip carrier 131, the anisotropic conductive sheet 112, and the substrate 7 are integrated.

Next is described the technical advantage of the fourth embodiment.

In the fourth embodiment, the reliability of the connecting portion is enhanced as in the first embodiment.

Further, the gap between the flexible substrate 2 and the substrate 7 can be advantageously controlled by varying the thickness of the anisotropic conductive sheet 112.

Moreover, the manufacturing process of the fourth embodiment is relatively simple because a soldering step is unnecessary. the present embodiments ate therefore, to be considered in all respects as illustrative and not restrictive, the scope of the invention being indicated by the appended claims rather than by the foregoing description and all changes which come within the meanings and range of equivalency of the claims are therefore intended to the embraced therein.

What is claimed is:

1. An electronic device assembly, comprising:

a first substrate having a first surface, a second surface and a connecting structure on said second surface;

a second substrate having a first surface, a second surface and a first pad formed on said second surface, said first pad facing said connecting structure of said first substrate;

a connecting member interposed between said first and second substrates and connecting said connecting structure and said first pad; and a resin provided between said first and second substrates, said first substrate being attached to said second substrate by said resin, wherein said connecting member includes a film and a conductive body provided in said film, said conductive body is interposed between and connects said first pad and said connecting structure, and said resin fills an area between said first substrate and said film and an area between said film and said second substrate wherein said connecting structure includes a through-hole provided in said first substrate, and at least a part of said conductive body is inserted into said through-hole.

2. An electronic device assembly according to claim 1, wherein said through-hole is tapered.

3. An electronic device assembly according to claim 1, wherein said first substrate includes a flexible substrate.

4. An electronic device assembly according to claim 1, further comprising an electronic device mounted on said first surface of said first substrate.

* * * * *